United States Patent [19]

Redwine

[11] Patent Number: 5,008,214
[45] Date of Patent: Apr. 16, 1991

[54] METHOD OF MAKING CROSSPOINT DYNAMIC RAM CELL ARRAY WITH OVERLAPPING WORDLINES AND FOLDED BITLINES

[75] Inventor: Donald J. Redwine, Houston, Tex.

[73] Assignee: Texas Instruments Incorporated, Dallas, Tex.

[21] Appl. No.: 384,858

[22] Filed: Jul. 21, 1989

Related U.S. Application Data

[60] Continuation of Ser. No. 274,164, Nov. 21, 1988, abandoned, which is a division of Ser. No. 201,812, Jun. 3, 1988, abandoned.

[51] Int. Cl.$^5$ .............................................. H01L 21/70
[52] U.S. Cl. ........................................ 437/52; 437/38; 437/47; 437/51; 437/60; 437/193; 437/195; 437/228; 437/233; 437/919
[58] Field of Search .................. 437/38, 47, 51, 52, 437/60, 191, 193, 195, 203, 228, 233, 249, 919; 357/23.6, 51

[56] References Cited

U.S. PATENT DOCUMENTS

| | | | |
|---|---|---|---|
| 4,737,829 | 4/1988 | Morimoto et al. | 365/149 |
| 4,769,786 | 9/1988 | Garnache et al. | 357/23.1 |

FOREIGN PATENT DOCUMENTS 152056  8/1985  Japan ..................... 357/23.6

*Primary Examiner*—Brian E. Hearn
*Assistant Examiner*—Tom Thomas
*Attorney, Agent, or Firm*—Ronald O. Neerings; Thomas W. Demond; Melvin Sharp

[57] ABSTRACT

A dynamic random access memory cell array is disclosed which has storage capacitors and access transistors formed on the sidewalls of pillars created by trenches etched into the face of a semiconductor bar. A storage capacitor for a cell uses the sidewalls of the pillar as one plate and a polysilicon plug or web as the other plate. The channel of each access transistor is formed in the upper part of the sidewall of only a portion of the pillar, using an upper edge of the capacitor region as the source region of the transistor and having an N+ drain region at the top of the pillar. A crosspoint array is made possible by merging two adjacent wordlines as a pair of overlying conductor strips extending along the face over the trenches, between pillars, and forming the transistor gates by alternate protrusions from these strips, extending down into the trenches at the channel area.

26 Claims, 5 Drawing Sheets

5,008,214

1

METHOD OF MAKING CROSSPOINT DYNAMIC RAM CELL ARRAY WITH OVERLAPPING WORDLINES AND FOLDED BITLINES

This application is a continuation of application Ser. No. 07/274,164, filed 11-21-88, now abandoned, which is a division of Ser. No. 07/201,812, filed 6-03-88, now abandoned.

BACKGROUND OF THE INVENTION

This invention relates to semiconductor devices and methods of making such devices, and more particularly to a dynamic random access memory cell and a process for manufacturing the cell.

Dynamic RAM devices are constructed in a so-called "folded bit line" arrangement to provide common mode noise rejection; folded bit line layouts are shown in U.S. Pat. No. 4,636,987, issued to Norwood et al, for example, and a modified version of a folded bit line is illustrated in U.S. Pat. Nos. 4,658,377 and 4,701,885; these patents are assigned to Texas Instruments. In the standard folded bit line layout, a true cross-point array is not possible in that every intersection of a word line and a bit line cannot have a cell; only half of these intersections can be populated with cells.

It is the principal object of this invention to provide an improved dynamic memory cell array of the type using a folded bit line layout, particularly a cell array allowing a true cross-point configuration. It is another object to provide a dynamic memory cell which is more easily constructed as a cross-point array so that the space occupied on the face of the bar is minimized. Another object is to provide a memory device of smaller size and optimum layout, and a method for making such a device.

SUMMARY OF THE INVENTION

In accordance with one embodiment of the invention a dynamic random access memory cell array has storage capacitors and access transistors formed at a face of a semiconductor bar, such as on the sidewalls of pillars created by trenches etched into the face of a semiconductor bar. In this example a storage capacitor for a cell uses the sidewalls of the pillar as one plate and a polysilicon plug or web as the other plate. The channel of each access transistor is formed in the upper part of the sidewall of only a portion of the pillar, using an upper edge of the capacitor region as the source region of the transistor and having an N+ drain region on the face. According to the invention, a cross-point array is made possible by merging two adjacent wordlines as a pair of overlying conductor strips extending along the face, between pillars in this case, and forming the transistor gates by alternate protrusions from these strips, extending down into the trenches at the channel area.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of particular embodiments, when read in conjunction with the accompanying drawings, wherein:

2

Figure 1:
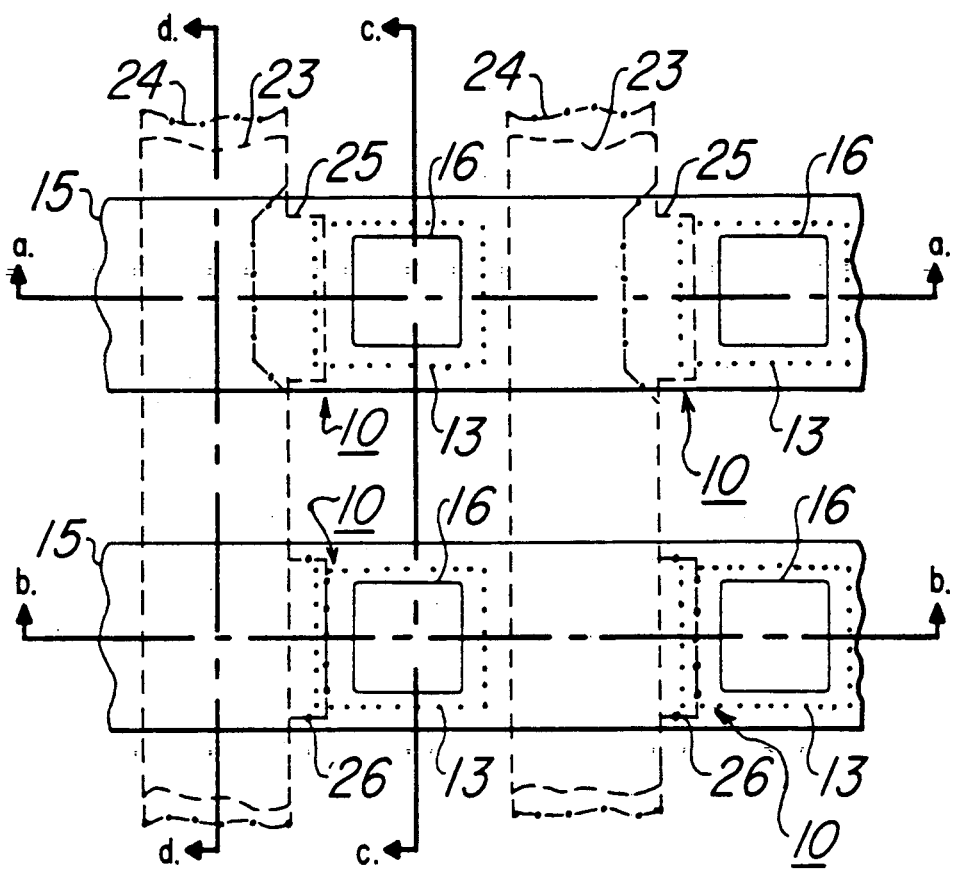
FIG. 1 is a plan view of a dynamic memory cell according to one embodiment of the invention.
Figure 2:
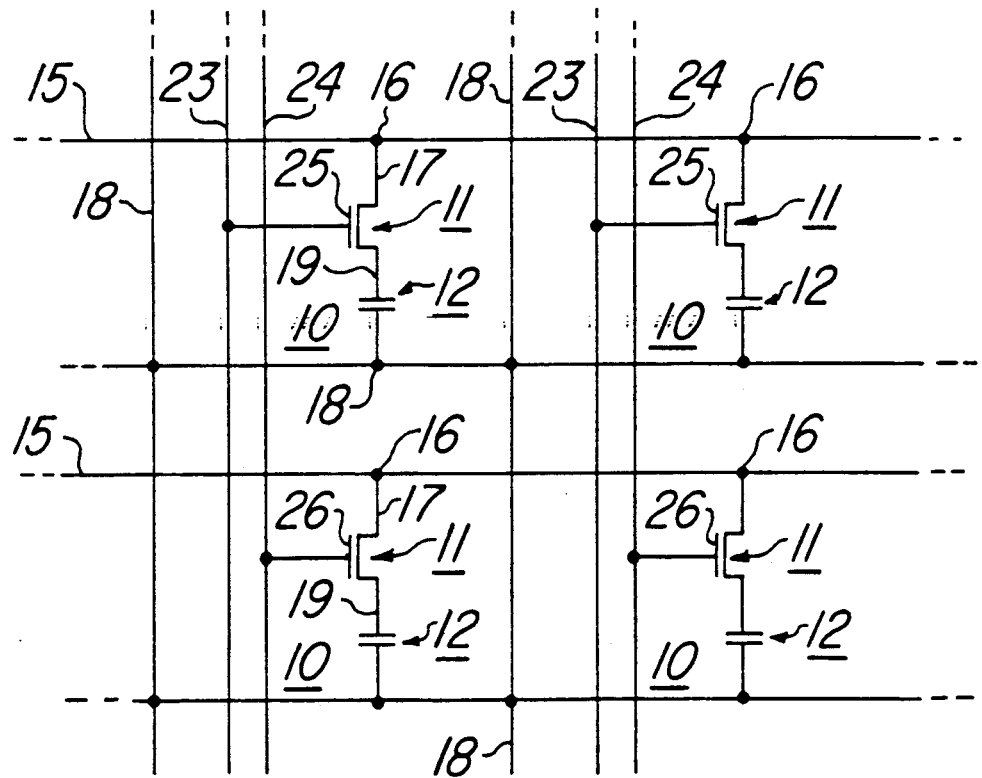
Figure 2A:
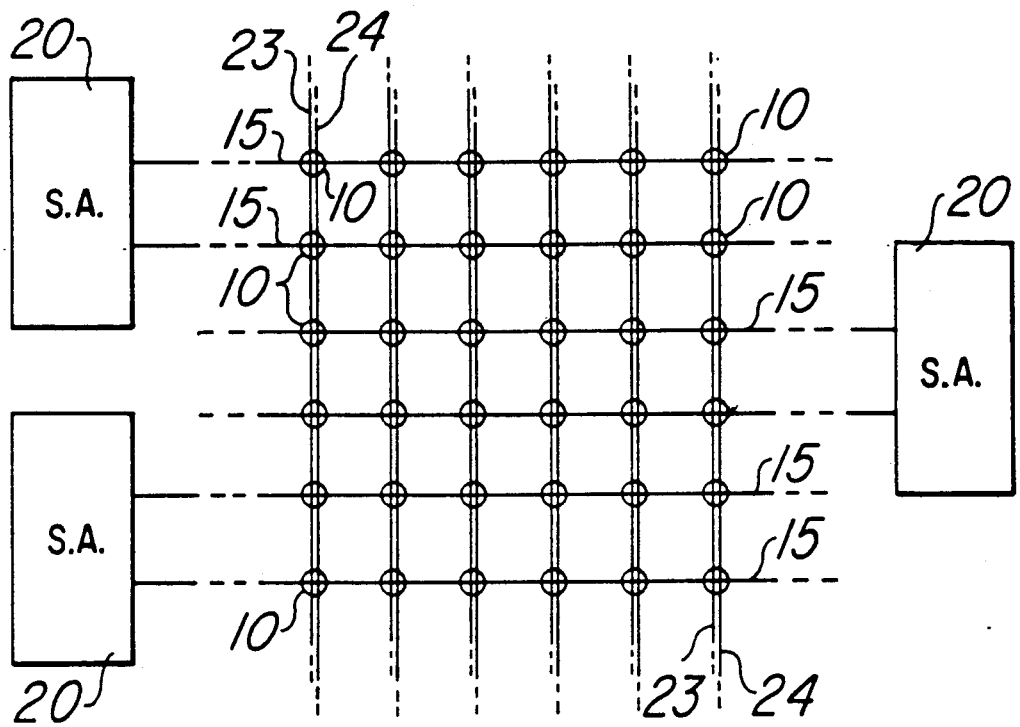
Figure 2B:
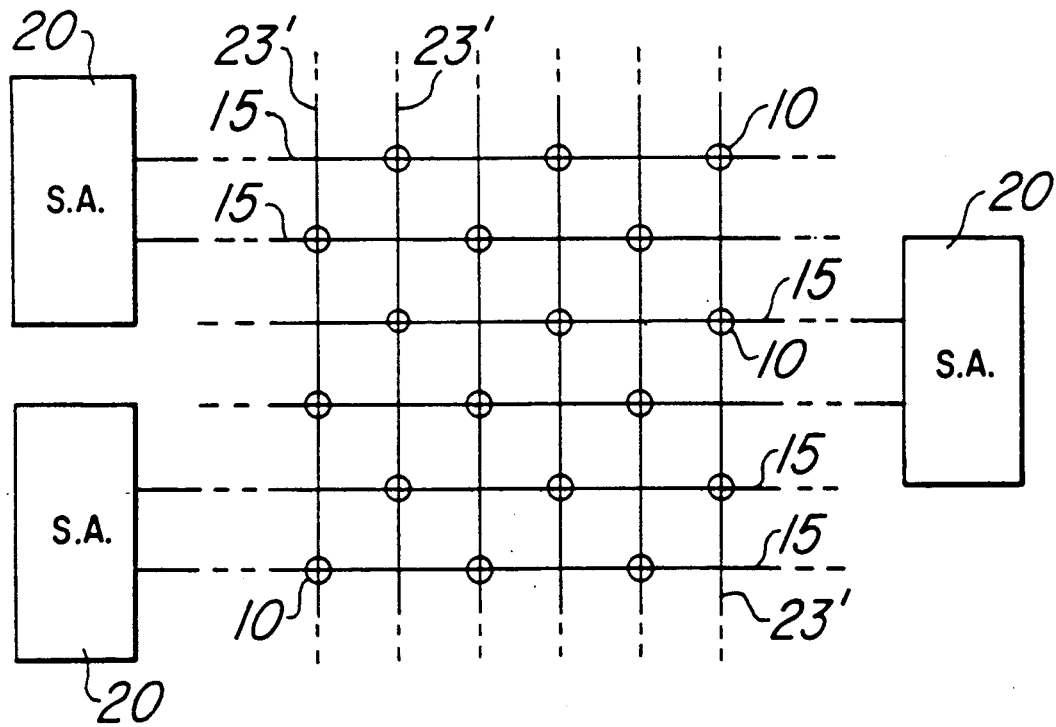
Figure 3A:
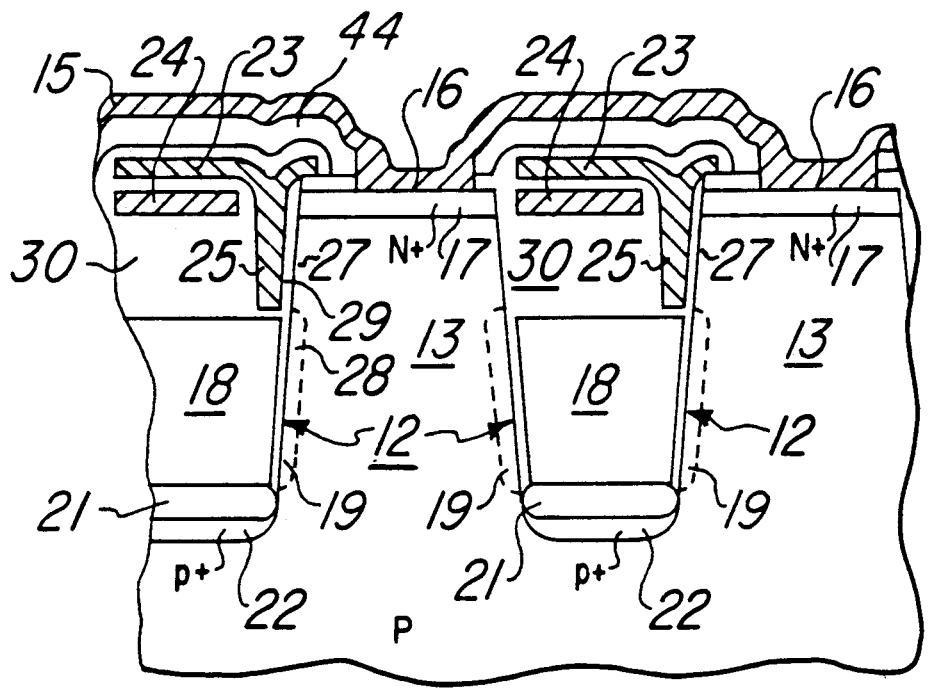
Figure 3B:
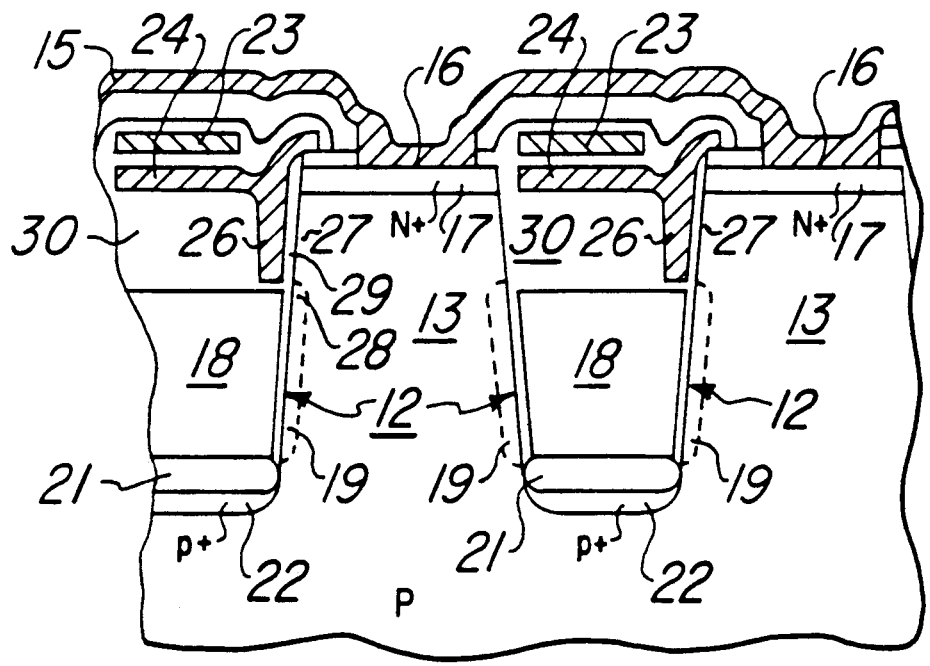
Figure 3C:
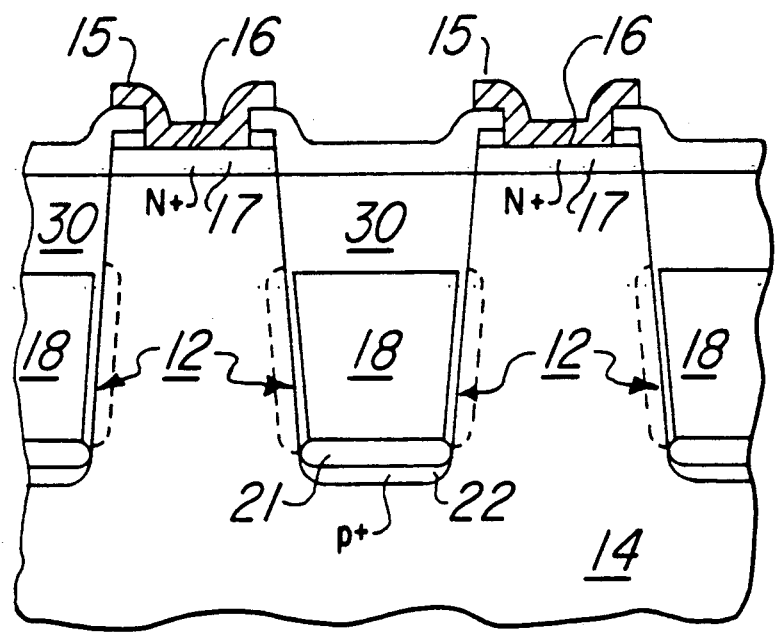
Figure 3D:
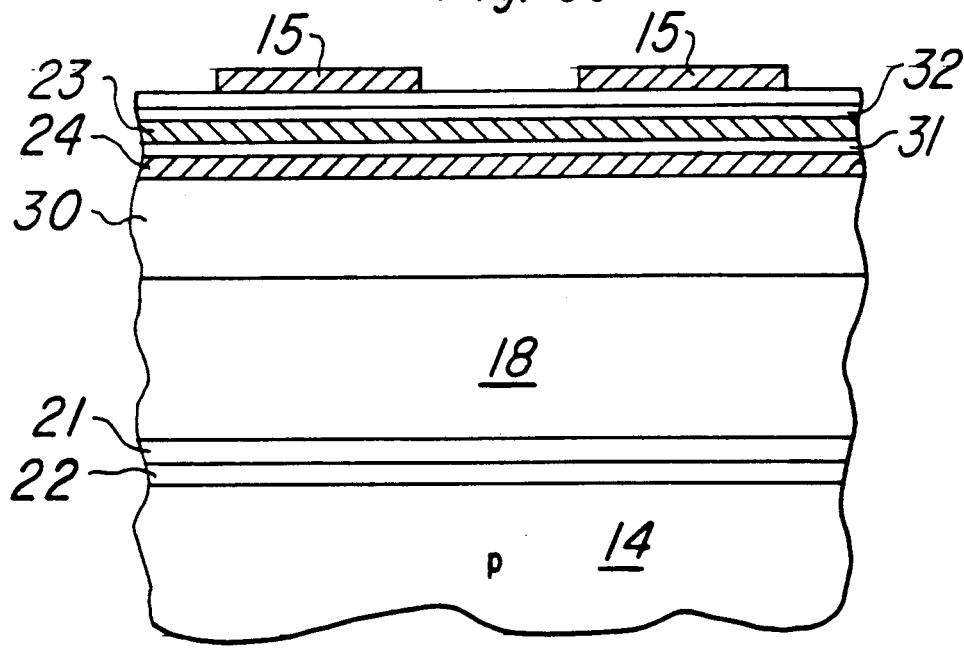
Figure 4A:
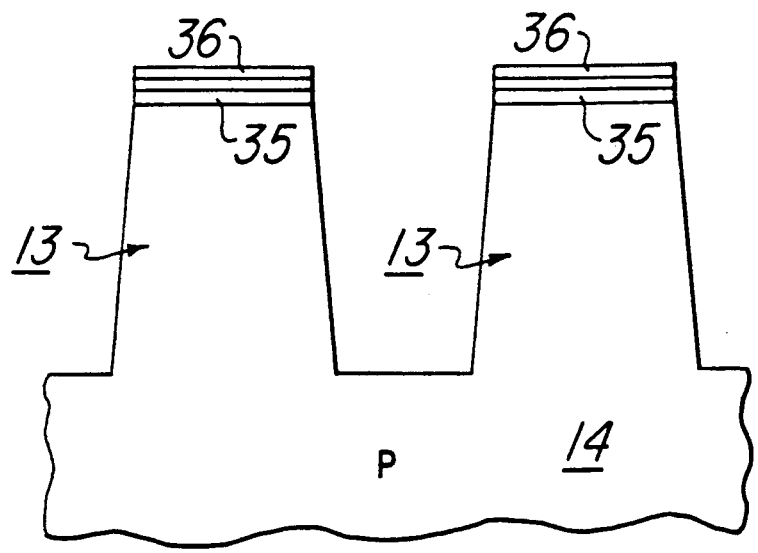
Figure 4B:
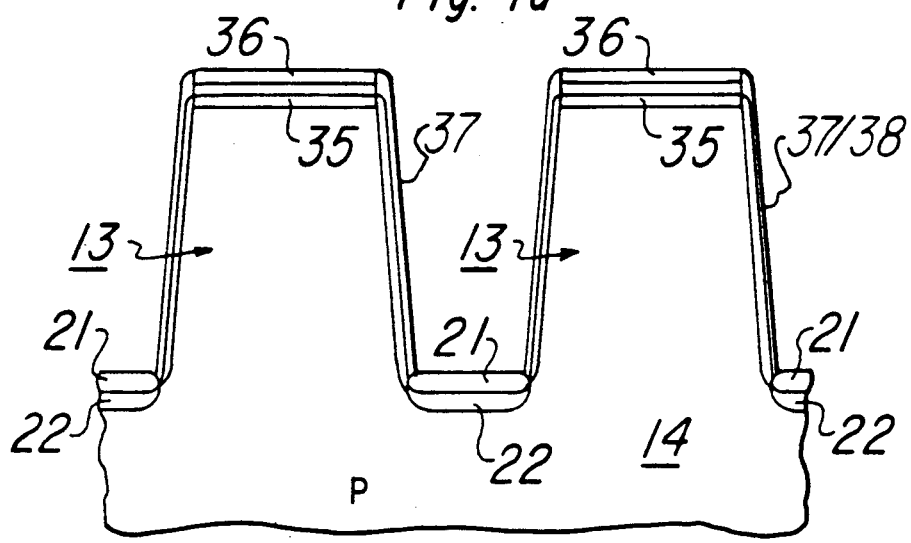
Figure 4C:
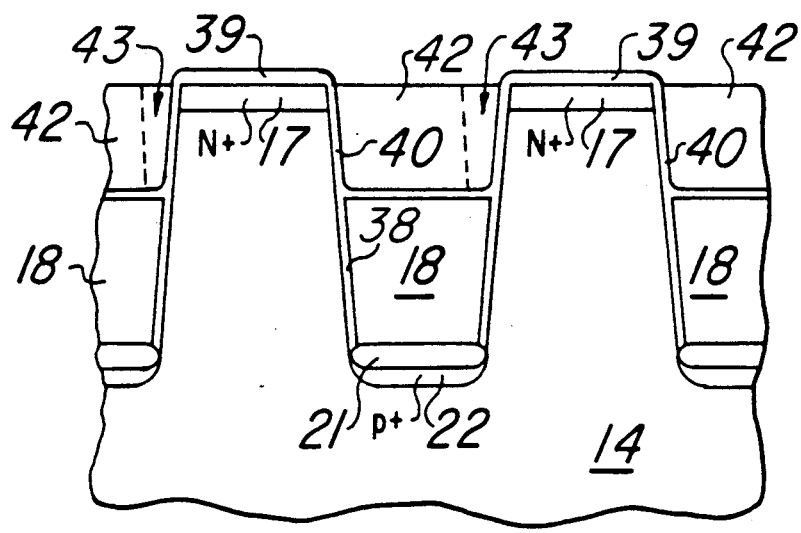

FIG. 2 is an electrical schematic diagram of the cell array of FIG. 1;

FIG. 2a is an electrical schematic diagram like FIG. 2 but including a larger part of the cell array;

FIG. 2b is an electrical schematic diagram like FIG. 2a but illustrating a prior art cell array;

FIGS. 3a-3d are elevation views in section of the cell of FIGS. 1 and 2, taken along the lines a—a, b—b, c—c and d—d of FIG. 1; and FIGS. 4a-4c are section views like FIG. 3a, at various stages of manufacture of the cell of FIGS. 1-3.

DETAILED DESCRIPTION OF SPECIFIC EMBODIMENTS

FIG. 1 is a plan view of a very small part of a dynamic RAM cell array constructed according to an embodiment of the invention, and FIGS. 2 and 2a and FIGS. 3a-3d illustrate an electrical schematic diagram and sectional views of the cells of FIG. 1. The view of FIG. 1 contains four one-transistor cells 10, each cell having an access transistor 11 and a capacitor 12, with each of these cells being formed on and surrounding a pillar 13 which is created in the face of a silicon bar 14. A metal bit line 15 extends across the tops of a column of cells, making a metal-to-silicon contact 16 to the drain region 17 of each access transistor 11. The capacitor 12 of each cell includes a polysilicon grid or web 18 extending throughout the cell array to provide a common plate which would be connected to a voltage such as Vdd at a position along the face of the chip spaced from the cells; that is, the polysilicon web 18 may be thought of as a plate filling the lower part of the space between pillars 13, with holes for the pillars to extend through. The other plate of each capacitor 12 is a semiconductor region 19 surrounding the pillar 13 for each cell, this semiconductor region in this case being inverted due to the voltage on the plate 18, although in another embodiment the plate 18 could be grounded and the region 19 formed by an N implant or diffusion. The capacitor regions 19 on the pillars 13 are isolated from one another by a field oxide layer 21 in the bottom of the trenches between the pillars, with a P+ channel-stop region 22 beneath the field oxide. Each pair of adjacent bitlines 15 of the array of cells 10 of FIGS. 1-3 is connected to a sense amplifier 20 as seen in FIG. 2a. These sense amplifiers may be of the type disclosed in the aforementioned U.S. Pat. Nos. 4,658,377, 4,656,377, or 4,701,885.

According to the invention, the wordlines in the cell array of FIGS. 1-3 are made up of overlapping polysilicon strips 23 and 24 extending along the face perpendicular to the bitlines 15. At alternating pillars, each of these strips 23 or 24 has a transistor gate 25 or 26 extending from the side of the strip and down into a recess adjacent to a sidewall 27 of a pillar, where this sidewall 27 in each case forms the channel of a transistor 11. The source of each access transistor 11 is created by the upper edge 28 of the semiconductor region 19 of a capacitor 12. Gate oxide 29 separates the gates 25 or 26 from the channels 27. The upper part of the space between pillars 13, above the polysilicon 18, is filled with oxide 30, and of course interlevel oxide 31 and 32 separates the first and second level polysilicon 23 and 24 and the metal bitline 15.

Referring to FIG. 2a, the advantage of the feature of stacking the two adjacent wordlines 23 and 24 on top of one another is that a true cross-point array is possible using folded bit line layouts. Each pair of bitlines 15 is connected at one end of the array to a sense amplifier 20, it being shown in this embodiment that the sense amplifiers are staggered, i.e. alternating from one side of the array to the other, but if the sense amplifiers are laid out to be narrower then all sense amplifiers can be on one side. Note that there is a cell 10 at every cross-point of a wordline (lines 23 and 24 considered together), and a bitline 15. This permits a more dense array, compared to the usual layout as seen in FIG. 2b, which requires half of the intersections of bitlines 15 and wordlines 23' to be unpopulated with cells 10 if a true folded bit line configuration is used. Crosspoint arrays have been constructed using cells as disclosed by Richardson, et al, in Proceedings of the International Electronic Devices Meeting, IEEE, 1985, pp. 714–717, but a quasi-folded bit line configuration was necessary as set forth in the above-mentioned patents.

A method of making the cell of FIGS. 1-3 will be described with reference to FIGS. 4a-4c. The starting material is a slice of P-type, semiconductor-grade, single-crystal silicon of which the portion of the bar 14 seen in the Figures is only a very minute part; the cells of FIG. 1 are of course only four of 4-Meg or 16-Meg on a bar, and perhaps several hundred bars would be formed on a slice at one time. Only the steps used to create the cell array will be described, it being understood that the periphery of the device would be made using CMOS processing as is usual at the present time, or in addition bipolar devices may be included as well. First, a coating of silicon oxide is thermally grown by exposing the slice to steam at an elevated temperature, and an arsenic implant is performed, as seen in FIG. 4a, to create an N+ layer 35 which will become the buried N+ drain regions 17; this implant will be masked as needed in the periphery. Then, a silicon nitride layer 36 is added over the oxide, the oxide and nitride layers are patterned using photoresist to leave uncovered the areas where the trenches are to be etched to leave the pillars. These trenches are next etched to a depth of perhaps 6 to 8 microns, using reactive ion etching, to leave the upstanding pillars 13 as seen in FIG. 4a. To create the field oxide layers 21, a thin thermal oxide coating is grown on the sidewalls, then a thin nitride coating 37 is deposited to cover the sidewalls of the pillars over this oxide, and an anisotropic etch is used to remove this thin nitride from the bottom flat surfaces between the pillars. A boron implant done at this point creates what will become the P+ channel-stop regions 22. Following the boron implant, an oxidation creates the field oxide 21. The nitride 37 is removed by etching, the sidewalls are cleaned, and the capacitor dielectric 38 is created as seen in FIG. 4b by thermal oxide growth or oxide plus nitride. A doped polysilicon deposition is performed next to fill the spaces between the pillars 13, and an anisotropic etch is done to remove this doped polysilicon down to a level of about two-thirds the pillar height, leaving the plugs or web 18. Next the original nitride 36 is stripped off, and any remaining oxide on the exposed sidewalls or tops of the pillars, and a thermal oxidation produces thick oxide 39 over the heavily-doped N+ drains 17 and thin oxide 40 on the sidewalls, as well as oxide on top of the web 18; a silicon nitride coating may be added over this oxide to function as an etch-stop. The upper parts of the areas between pillars (above web 18) is now filled with deposited oxide 42, and the deposited oxide is etched back to the level of the pillar tops. Using a photoresist mask which exposes holes over where alternate gates 25 or 26 are to be, an anisotropic etch is performed to create recesses 43 where half of the gates are to be created. Referring back to FIGS. 1 and 3a-3d, a first level of polycrystalline silicon is next deposited, then patterned to leave the strips 24 and gates 26. The first-level polysilicon is oxidized to create the interlevel oxide 31, and then a second set of recesses (like the recesses 43) are etched using another photoresist masking operation, to allow the gates 25 for the other half of the cells to be created by second-level polysilicon; to this end, a layer of polycrystalline silicon is deposited over the oxide 31 and extending into the second set of recesses, then patterned using photoresist. The second-level polysilicon is oxidized to create the layer 32. Then a thick oxide 44 is deposited, and another photoresist masking operation is used to open the holes for the contacts 16, followed by a metal deposition and patterning to leave the bitlines 15.

Although a pillar type cell has been disclosed, the concept of the invention can be used in various other cells, such as a trench type cell as disclosed in the aforementioned Richardson et al article, or various other cells of this type.

While this invention has been described with reference to illustrative embodiments, this description is not meant to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making a one-transistor, dynamic random access memory cell array of the type having a storage capacitor and an access transistor for each cell of the array, comprising the steps of:

applying a mask material to a face of a semiconductor body and selectively removing the coating to leave exposed trench areas, etching trenches into said face at said trench areas, to leave a pattern of rows and columns of pillars at said face, filling said trenches with a conductive web to a level substantially below the tops of said pillars, the conductive web surrounding capacitor areas in the sidewalls of said pillars, each of said capacitor areas being isolated from capacitor areas of other pillars by isolating means at the bottom of said trenches, providing a transistor drain region at the top of each of said pillars, and connecting the transistor drain regions of all of the pillars in each row together by an overlying conductor to provide a bit line for each column, forming a pair of overlapping wordlines in each of the trenches between each row of pillars, the wordlines extending along said face perpendicular to said bitlines, and forming a transistor gate region for each pillar extending along the sidewall of the pillar between the transistor drain region at the top of the pillar and the upper part of said conductive web said transistor gate regions in a row of cells being connected to alternating ones of the pair of wordlines for said row of cells.

2. A method according to claim 1 wherein said conductive web and said wordlines are composed of a material including polycrystalline silicon.

3. A method according to claim 1 wherein said conductive web creates one plate of the capacitor of all of the cells in said array.

4. A method according to claim 3 wherein said conductive web is connected to a voltage source to create said capacitor region by inverting the semiconductor surface.

5. A method according to claim 1 including the step of forming said transistor drain regions by an N+ implant performed prior to said step of etching said trenches.

6. A method according to claim 1 including the steps of forming insulating coatings between said transistor gates and the sidewall of the pillars and between the overlying wordlines.

7. A method of forming first and second adjacent memory cells in a device comprising an array of memory cells created along a semiconductor surface wherein the first and second cells includes a storage capacitor and an access transistor, the method comprising the steps of:
forming a plurality of bit lines and a plurality of pairs of overlapping word lines with each overlapping pair crossing the bit lines;
creating a plurality of memory cells each positioned near a crossing of a bit line and a word line pair, for electrical association with a bit line and a word line, forming rows and columns of cells, each row of cells being positioned for electrical association with a word line pair and each memory cell comprising a transistor having a channel region and a gate for controlling conduction through the channel region; and
alternately connecting each word line of a first one of said pairs to gates of alternate transistors in a first one of said rows to effect electrical association of said first word line pair with said first row of cells.

8. The method of claim 7 wherein transistors in every row of memory cells are alternately connected to one of a pair of wordlines to create a cross point array of memory cells.

9. The method of claim 7 wherein the gate of each transistor in said first row is formed in connection with one of the word lines of said first pair when said word lines are formed.

10. The method of claim 7 wherein the gates of alternate transistors connected to a first one of said first word line pair are simultaneously formed with the first one of said first pair by depositing a first level of polycrystalline silicon.

11. The method of claim 10 wherein the step of simultaneously forming the alternate gates with said one of said first word line pair includes the step of etching a recess near the channel regions of alternate transistors and then filling the recesses with the deposited silicon to form the gates of alternate transistors in said first row.

12. The method of claim 7 wherein:
the gates of alternate transistors connected to a first one of said first word line pair are simultaneously formed with the first one of said first pair; and
the gates of alternate transistors connected to the second one of said first word line pair are simultaneously formed with the second one of said first pair.

13. The method of claim 12 wherein the first word line pair and the gates of all transistors connected to said first word line pair are formed with two levels of conductive material.

14. The method of claim 13 wherein the step of forming each of the two levels of conductive material includes the step of depositing polycrystalline silicon.

15. The method of claim 7 wherein the step of creating memory cells comprises forming a storage capacitor and a single transistor for each cell.

16. The method of claim 15 wherein transistors in every row of memory cells are alternately connected to one of a pair of wordlines to create a cross point array of memory cells.

17. The method of claim 15 wherein:
the gates of alternate transistors connected to a first one of said first word line pair are simultaneously formed with the first one of said first pair; and
the gates of alternate transistors connected to the second one of said first word line pair are simultaneously formed with the second one of said first pair.

18. The method of claim 15 wherein the step of creating memory cells includes:
patterning and etching a mask material to the semiconductor surface to define and expose trench areas;
etching trenches through the exposed areas and into the semiconductor material to define a pattern of rows and columns; and
forming a charge storage region in one of the trenches for each cell with each cell including only one transistor, said one transistor formed as an access transistor for operative association with the cell charge storage region.

19. The method of claim 18 wherein the access transistors are formed by:
defining a drain region along the semiconductor surface between adjacent trenches in a row to create a channel region between each drain region and an adjacent cell storage region with a portion of the adjacent cell storage region serving as a source region of the transistor.

20. The method of claim 19 wherein the step of forming overlapping pairs of word lines is performed in conjunction with transistor gate formation such that the word lines and transistor gates are simultaneously formed in electrical connection.

21. The method of claim 18 wherein the pattern and etch steps to form trenches provide rows and columns of pillars with trench regions separating the pillars and wherein the word lines are formed along the trenches.

22. The method of claim 21 wherein at least a portion of one word line of said first pair is positioned in one of the trenches.

23. The method of claim 18 wherein a plurality of the charge storage regions are interconnected along rows and columns of tenches to form a conductive web.

24. The method of claim 23 wherein the conductive web is connectable to a voltage source to create a capacitor region by inverting the semiconductor region along the pillars.

25. The method of claim 23 wherein the conductive web fills the trenches to a level substantially below the semiconductor surface and the transistors extend from the conductive web to the semiconductor surface.

26. The method of claim 23 wherein the steps of forming wordlines and transistors includes the step of providing an insulating layer between word lines in each pair and between the channel region and gate of each transistor.

* * * * *